United States Patent [19]

Marino

[11] 4,286,292
[45] Aug. 25, 1981

[54] TELEVISION RECEIVER SUPPLY CIRCUIT

[75] Inventor: Francesco Marino, Caserta, Italy

[73] Assignee: Indesit Industria Elettrodomestici Italiana S.p.A., Italy

[21] Appl. No.: 136,840

[22] Filed: Apr. 3, 1980

[30] Foreign Application Priority Data

Apr. 5, 1979 [IT] Italy ............................. 67712 A/79

[51] Int. Cl.³ .............................................. H04N 5/44
[52] U.S. Cl. ................................................... 358/190
[58] Field of Search ...................... 358/190; 323/22 T

[56] References Cited

U.S. PATENT DOCUMENTS 4,028,606  6/1977  Beuchee et al. ......................... 321/2
4,118,739  10/1978  Umehara ............................... 358/190

*Primary Examiner*—Robert L. Richardson
*Attorney, Agent, or Firm*—Lerner, David, Littenberg & Samuel

[57] ABSTRACT

A television receiver supply circuit includes a transistor driven between saturation and cut off periodically to chop the B+ voltage. The pilot pulses are derived from a pilot pulse source such as flyback pulses on a winding of the line output transformer. To prevent parasitic oscillations a second transistor is provided to ensure that the impedance seen by the winding of the line output transformer remains substantially constant during the flyback pulses.

9 Claims, 1 Drawing Figure

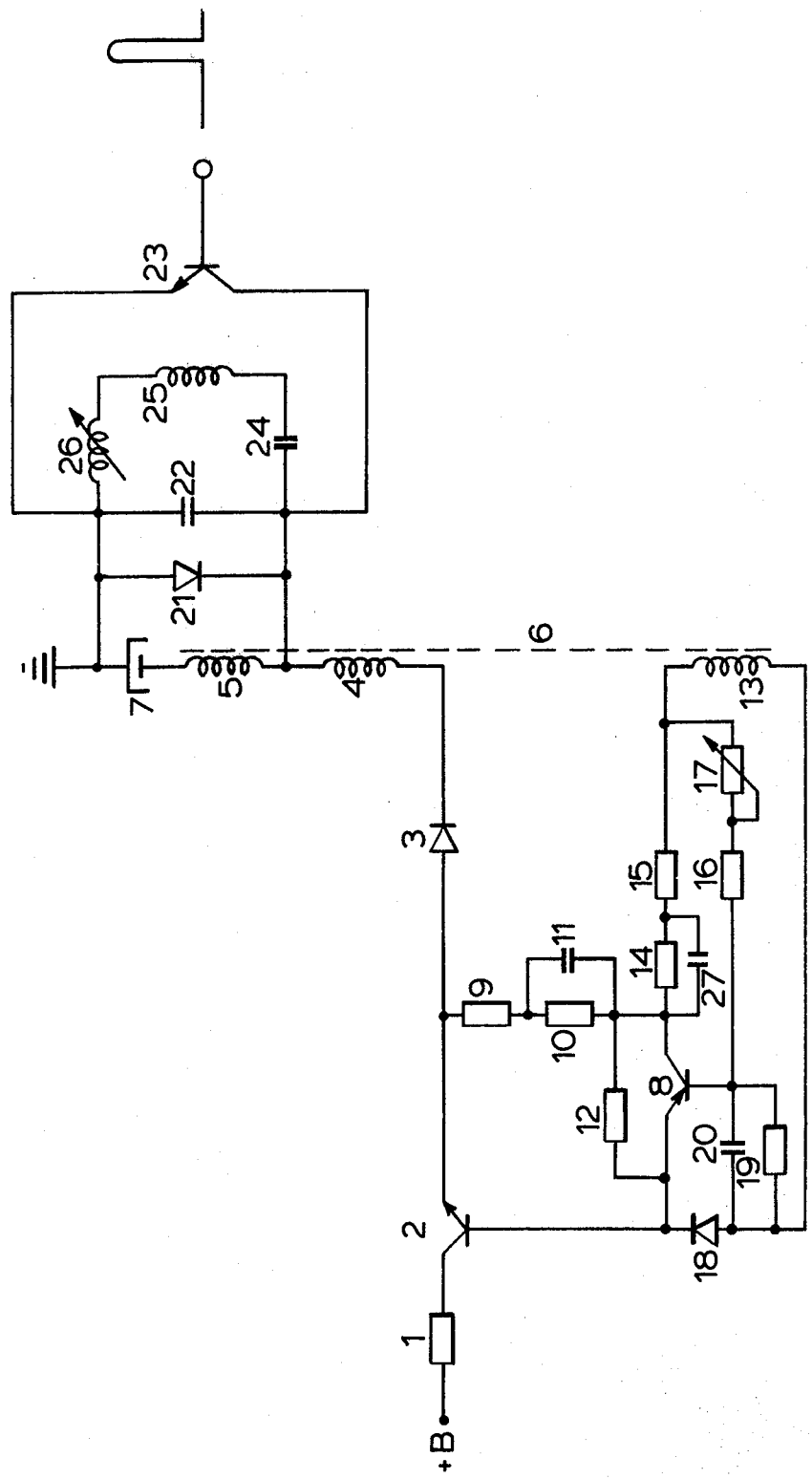

TELEVISION RECEIVER SUPPLY CIRCUIT

The present invention relates to a television receiver supply circuit consisting of an essentially d.c. supply voltage source and a switch that, by means of appropriate pilot pulses from a pilot pulse source, cuts off current periodically from the supply voltage source to the load circuit.

Supply circuits known as "choppers" are commonly used on television sets for converting the high d.c. voltage produced by rectifying or levelling mains supply voltage into low d.c. voltage which can be used, among other things, for direct supply of a normal horizontal-deflection transistor. These chopper circuits usually consist of a transistor with a switch function, connected between the high d.c. voltage source and the horizontal-deflection circuit, which is made conductive by pilot pulse signals for a given length of time, e.g. during the horizontal retrace interval. In this way, supply voltage only reaches the deflection circuit for part of the operation of the device and its average value is, consequently, only part of the voltage at the input of the chopper circuit. The pilot pulses for the transistor-switch are usually supplied by an additional winding on the line transformer and make the transistor conductive during the horizontal retrace interval.

Chopper circuits may be divided into two different groups: a first one which utilizes a transistor only as a switch and so during its working cycle the transistor is cut off and saturated alternately; a second one which utilizes a transistor as a variable resistance device in order to vary also the value of the D.C. voltage available at the output terminals, that is to say the peak value of the chopped signal is controlled to vary the mean D.C. value.

This last performance is obtained owing to the fact that during the working cycle the transistor is never completely saturated, but by varying its conduction the value of the current flowing in it is varied and thus the value of the voltage available at the output terminals. One possible example of a circuit working according to this last technique is given in the article appearing in "SGS Planar News, vol. 3, No. 1, April 1972" entitled "Solid state colour, black and white television." The operation of this same circuit is more fully set out in French Pat. No. 2,116,355.

Both these groups of circuits, though excellent from the saving point of view in that they do away with the need for a supply transformer, have some drawbacks. Circuits of the first group have the following drawback: as the pilot signal source supplying the transistor is closely coupled both to the horizontal-deflection circuit and the transistor itself (so that any interference on the chopper circuit may be transferred to the horizontal-deflection circuit), and, as the load (consisting essentially of the transistor-switch input terminals) at the terminals of the line transformer additional winding varies sharply its impedance during the operating cycle of the device, owing to the fact that the transistor is periodically saturated and disabled, parasitic oscillations are generated in the transformer by inductance leakage of the transformer itself which, besides threatening to damage the chopper transistor or final line stage, produce light and dark vertical lines on the television screen.

Circuits of the second group have a different type of drawback. As the switching transistor is never saturated, the power dissipated by the transistor is greater than the power dissipated by an equivalent saturated transistor and therefore it is necessary to use a more powerful and more expensive transistor.

The purpose of the present invention is to provide a television receiver supply circuit to overcome these problems.

According to the present invention there is provided in a television receiver having a load circuit, a d.c. supply voltage source and a pilot pulse source, a supply circuit including a first transistor responsive to the pulses from the pilot pulse source to be switched between saturation and cut off so as to conduct current periodically from the supply voltage source to the load circuit, the improvement comprising connecting means arranged between the first transistor and pilot pulse source and operative to maintain the impedance at the output of the pilot pulse source substantially constant during the operating cycle of the supply circuit.

The invention will now be described in detail with reference to the attached drawing, provided by way of a non-limiting example and showing a supply circuit of a television receiver according to the present invention.

In the diagram +B is a supply terminal which receives the high d.c. voltage produced in the known way by rectifying and smoothing the a.c. mains supply voltage. This d.c. voltage is supplied to the collector of an NPN transistor 2 via a current-limiting resistor 1. The emitter of transistor 2 is connected to the anode of a diode 3 the cathode of which is grounded by way of a series combination formed of two windings 4 and 5 (part of transformer 6) and a capacitor 7. The emitter of transistor 2 is further connected to the collector of PNP transistor 8 via two resistors 9 and 10, connected in series with one another. The emitter of transistor 8 is connected to the base of trnsistor 2. Parallel to resistor 10 there is a capacitor 11, and a resistor 12 is connected parallel to the emitter-collector section of transistor 8.

The collector of transistor 8 is further connected to one end of another winding 13 of transformer 6 via two series connected resistors 14 and 15. The base of transistor 8 is connected to the same end via resistor 16 and variable resistor 17, connected in series. The base of transistor 2 is connected to the cathode of diode 18 the anode of which is connected, at one end, directly to the other end of winding 13 and at the other to the base of transistor 8 via a parallel RC circuit consisting of resistor 19 and condenser 20.

Parallel to the series combination of winding 5 and capacitor 7 there are connected in parallel an energy recovery diode 21, a retrace capacitor 22 and the collector-emitter section of NPN deflection transistor 23. Transistor 23 receives a pilot pulse at its base which makes it conductive periodically. Parallel to capacitor 22 there are connected trace capacitor 24, deflection coil 25 and linearity coil 26 connected in series with one another. A further capacitor 27 is connected parallel to resistor 14.

The circuit described operates as follows:

It is first necessary to bear in mind that the circuit shown in the figure is of the type wherein the transistor 2 is either cut-off or fully saturated. The d.c. voltage at terminal +B is only applied to the horizontal-deflection circuit (transistor 23 and associated components) via transistor 2 during part of the deflection cycle, that is, during the horizontal retrace interval. This is because the base of transistor 2 is supplied with appropriate pilot signals from winding 13 of line output transformer 6.

The polarity of these signals is such that the fly-back pulse causes the transistor, which is normally cut off, to be saturated so as to supply the deflection circuit with energy only for part of the operating cycle. Consequently, the voltage at the terminals of capacitor 22 is lower than that at terminal +B and directly proportional to the conduction time of transistor 2 expressed as a fraction of the operating cycle. The function of diode 3 is to prevent reverse voltages generated in the windings of transformer 6 from being supplied to the emitter of transistor 2 and damaging it.

The pilot signals for transistor 2 are not sent directly from the pilot signal source consisting of winding 13 but via a network of connecting components including, inter alia, transistor 8. The function of the latter is to prevent the formation of parasitic oscillations on winding 13 and operates as follows. After transistor 2 has been made conductive by the fly-back pulse supplied to its base by protection diode 18, capacitor 20 is charged exponentially with a time constant determined by resistors 16, 17 and 19. When the voltage across capacitor 20 exceeds the conduction threshold of diode 18 and the base-emitter connection of transistor 8, the latter becomes saturated and disables transistor 2 by cutting off its pilot pulses. Thus, the charging of capacitor 20 determines the conduction time of transistor 8 and also of transistor 2. As a result, acting on the charging time of capacitor 20 it is possible to vary the conduction time of transistor 2 during the flyback period and to regulate in this way the value of the d.c. voltage furnished at the output terminals of the circuit. In addition, by means of the shown circuit, the impedance at the terminals of winding 13 remains essentially constant throughout the operating cycle owing to the fact that one or other of transistors 2 and 8 is always saturated. This prevents parasitic oscillations from being generated in winding 13, caused by inductance leakage on the transformer and the presence of a highly variable load at the terminals of winding 13, which could reach the deflection circuit via windings 4 and 5.

The function of variable resistor 17 is to regulate the charging time of capacitor 20 and, consequently, as previously mentioned, the conduction time of transistor 2 and the voltage level across capacitor 22. The value of this voltage depends on the energy supplied to horizontal deflection coils 25 so that, by adjusting it, horizontal amplitude can be regulated. The horizontal-deflection circuit is of a conventional type and therefore needs no explanation here. A number of components of the circuit, however, are worth mentioning. The function of resistors 9, 10 and 12 is to bias transistor 2 while resistors 14 and 15 are current-limiting resistors. The function of capacitor 11 is to speed up disabling of transistor 2 by reducing the impedance of assembly 10 and 11 during transients, so reducing also the power dissipated on transistor 2. The function of capacitor 27 is to reduce the impedance of assembly 14 and 27 when transistor 2 has to start conducting by allowing a higher pilot current peak to reach the base of transistor 2. The following is a list of part ratings used on a successful experimental version of the circuit described.

RATING TABLE

| 1 resistor | 27 ohm | 16 resistor | 680 ohm |
| --- | --- | --- | --- |
| 2 transistor | BU 134 | 17 Var. resistor | 1 Kohm max. |
| 3 diode | 1N4004 | 18 diode | BA 157 |
| 7 condenser | 470 µF | 19 resistor | 330 ohm |
| 8 transistor | BC 327 | 20 capacitor | 47 nF |
| 9 resistor | 6.8 ohm | 21 diode | SF2M1 |
| 10 resistor | 18 ohm | 22 capacitor | 82 nF |
| 11 capacitor | 470 µF | 23 transistor | BU 312 |
| 12 resistor | 68 ohm | 24 capacitor | 4.7 µF |
| 14 resistor | 270 ohm | 27 capacitor | 470 nF |
| 15 resistor | 27 ohm | +B supply voltage | 230V d.c. |

The advantages of the present invention will be clear from the description given. In particular, the possibility of avoiding parasitic oscillations in the line transformer and the possiblity of using low power switching transistors.

To those skilled in the art, it will be clear that a number of variations can be made to the circuit described without, however, departing from the scope of the present invention as set out in the appended claims.

I claim:

1. In a television receiver having a load circuit, a d.c. supply voltage source, and a pilot pulse source, a supply circuit including a first transistor responsive to the pulses from the pilot pulse source to be switched between saturation and cut off so as to conduct current periodically from the supply voltage source to the load circuit, the improvement comprising connecting means arranged between the first transistor and pilot pulse source and operative to maintain the impedance at the output of the pilot pulse source substantially constant during the operating cycle of the supply circuit.

2. A television receiver supply circuit according to claim 1, wherein the said connecting means include a second transistor.

3. A television receiver supply circuit according to claim 2, wherein the said second transistor has its output terminals connected to the input terminals of the said first transistor and its input terminals connected to the output terminals of the said pilot pulse source.

4. A television receiver supply circuit according to claim 3, wherein in order to cut off the said first transistor periodically, the said second transistor conducts the whole time the said first transistor to be kept cut off so as to prevent the said pilot pulse from reaching the input terminals of the said first transistor.

5. A television receiver supply circuit according to claim 2, wherein the said connecting means include timing means, consisting of a capacitative resistive network, for determining conduction time of the said second transistor.

6. A television receiver supply circuit according to claim 5, wherein said timing means are arranged in the path leading from said pilot pulse source to input terminals of said second transistor to determine the time interval during which said pilot pulses are supplied by said second transistor to said first transistor.

7. A television receiver supply circuit according to claim 6, wherein said timing means are variable and serve for varying the time interval during which said pilot pulses are supplied by said second transistor to said first transistor.

8. A television receiver supply circuit according to claim 7, wherein said timing means comprise a variable resistance device.

9. A television receiver supply circuit according to any one of the preceding claims, wherein the said pilot pulses are repeated at line scanning frequency and the said pilot pulse source consists of an additional winding of the line deflection stage output transformer.

* * * * *